United States Patent
Toyoda

(10) Patent No.: US 7,307,693 B2
(45) Date of Patent: Dec. 11, 2007

(54) ILLUMINATION OPTICAL DEVICE, PHOTOLITHOGRAPHY MACHINE, AND EXPOSURE METHOD

(75) Inventor: Mitsunori Toyoda, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 8 days.

(21) Appl. No.: 10/521,590

(22) PCT Filed: Jun. 17, 2003

(86) PCT No.: PCT/JP03/07692

§ 371 (c)(1),
(2), (4) Date: Jan. 18, 2005

(87) PCT Pub. No.: WO2004/010483

PCT Pub. Date: Jan. 29, 2004

(65) Prior Publication Data
US 2005/0254033 A1    Nov. 17, 2005

(30) Foreign Application Priority Data
Jul. 18, 2002  (JP) ............................ 2002-208985

(51) Int. Cl.
*G03B 27/54*  (2006.01)
*G03B 27/42*  (2006.01)
(52) U.S. Cl. ........................................ 355/67; 355/53
(58) Field of Classification Search ............... 355/53, 355/67–71; 359/350, 355; 501/53, 54
See application file for complete search history.

(56) References Cited

U.S. PATENT DOCUMENTS

| | | | |
|---|---|---|---|
| 5,699,183 A * | 12/1997 | Hiraiwa et al. ............ | 359/355 |
| 5,912,725 A | 6/1999 | Tanitsu | |
| 6,303,900 B1 | 10/2001 | Tachikawa | |
| 6,373,554 B1 | 4/2002 | Jinbo et al. | |
| 6,377,332 B1 * | 4/2002 | Sakuma et al. ............ | 355/53 |
| 6,483,639 B2 | 11/2002 | Fujinoki et al. | |
| 6,563,567 B1 * | 5/2003 | Komatsuda et al. ......... | 355/71 |
| 6,597,498 B1 | 7/2003 | Schuster | |
| 6,680,803 B2 | 1/2004 | Schultz et al. | |
| 6,741,394 B1 * | 5/2004 | Tanitsu et al. ............. | 359/619 |
| 2002/0030890 A1 * | 3/2002 | Kato et al. ............... | 359/576 |
| 2003/0227684 A1 * | 12/2003 | Goto ........................ | 359/566 |

FOREIGN PATENT DOCUMENTS

| | | |
|---|---|---|
| DE | 100 62 579 A1 | 6/2001 |
| DE | 100 29 938 A1 | 7/2001 |
| EP | 854374 A2 | 7/1998 |
| JP | A 2001-53002 | 2/2001 |

(Continued)

*Primary Examiner*—Henry Hung Nguyen
(74) *Attorney, Agent, or Firm*—Oliff & Berridge, PLC

(57) ABSTRACT

An illumination optical device, wherein a micro channel is not generated practically in a diffractive optical element arranged in an optical path of pulse laser light having high energy density. An illumination optical device having a light source (1) for supplying pulse laser light, wherein an irradiated plane (M) is illuminated with light from this light source. The illumination optical device comprises a diffractive optical element (4) arranged in an optical path between a light source and an irradiated plane, through which a light beam having an energy density of 1 $mJ/cm^2$/pulse or more passes. The diffractive optical element is formed by an oxide crystal material such as quartz crystal.

20 Claims, 3 Drawing Sheets

FOREIGN PATENT DOCUMENTS

| | | |
|---|---|---|
| JP | A 2001-176772 | 6/2001 |
| JP | A 2001-338861 | 12/2001 |
| JP | A 2002-040327 | 2/2002 |
| JP | A-2002-323658 | 11/2002 |
| JP | A 2002-323658 | 11/2002 |
| WO | WO 00/67303 A1 | 11/2000 |

* cited by examiner

ILLUMINATION OPTICAL DEVICE, PHOTOLITHOGRAPHY MACHINE, AND EXPOSURE METHOD

TECHNICAL FIELD

The present invention relates to an illumination optical device, a photolithography machine, and an exposure method, and more particularly to an illumination optical device suitable for a photolithography machine for manufacturing micro devices such as a semiconductor device, an image pickup device, a liquid crystal display device, and a thin film magnetic head in a lithography step.

BACKGROUND ART

In a typical photolithography machine of this kind, a light beam emitted from a light source enters a fly's eye lens. Then, a secondary light source constructed from many light source images is formed on the rear side focal plane thereof. A light beam from the secondary light source is limited through an aperture stop arranged in the vicinity of the rear side focal plane of the fly's eye lens, and then, enters a condenser lens. The aperture stop limits a shape or a size of the secondary light source to a desired shape or a desired size according to desired illumination conditions (exposure conditions).

A light beam condensed by the condenser lens illuminates in a state of superimposition a mask in which a given pattern is formed. Light passing through the pattern of the mask forms an image on a wafer through a projection optical system. Thereby, the mask pattern is projected and exposed (transferred) on the wafer. The pattern formed on the mask is highly integrated. Therefore, in order to correctly transfer this fine pattern on the wafer, it is essential to obtain a uniform illumination intensity distribution on the wafer.

In these years, a technique, wherein coherency σ of illumination (σ value=aperture stop diameter/pupil diameter of projection optical system, or σ value=numerical aperture on emission side of illumination optical system/numerical aperture on entrance side of projection optical system) is changed by changing a size of a secondary light source formed by a fly's eye lens by changing a size of an aperture part (light transmittance part) of an aperture stop arranged on an emission side of the fly's eye lens is noted. Further, a technique, wherein a depth of focus and a resolution of a projection optical system are improved by limiting a shape of a secondary light source formed by a fly's eye lens to an annular shape or a quadrupole shape by setting a shape of an aperture part of an aperture stop arranged on an emission side of the fly's eye lens to an annular shape or a four hole shape (that is, quadrupole shape) is noted.

As described above, in the related art, in order to perform modified illumination (annular illumination or quadrupole illumination) by limiting the shape of the secondary light source to the annular shape or the quadrupole shape, a light beam from a relatively large secondary light source formed by the fly's eye lens is limited by the aperture stop having the annular or quadrupole aperture part. In other words, in the annular illumination or the quadrupole illumination in the related art, a substantial part of the light beam from the secondary light source is blocked by the aperture stop, and does not contribute to illumination (exposure). In result, due to light amount loss in the aperture stop, there are disadvantages that an illumination intensity on the mask and the wafer is lowered, and throughput as a photolithography machine is lowered.

In order to solve these disadvantages, a technique, wherein a light beam from a light source is transformed into a light beam having a given cross section shape and an angle element by an optical integrator constructed from a diffractive optical element or a micro lens array (refractive optical element), and an illumination field in a desired shape (annular shape, quadrupole shape and the like) is formed on an entrance surface of a fly's eye lens by a diffractive optical element as a light beam transformation device based on this light beam (then, a secondary light source in a desired shape is formed on an emission surface of the fly's eye lens) is suggested.

However, in this related art, for example, when a pulse oscillation type laser light source such as a KrF excimer laser light source and an ArF excimer laser light source is used, a diffractive optical element or a micro lens array as a light beam divergence device is irradiated with pulse laser light having very high energy density. In result, a micro channel (minute hole) is generated on an emission surface of the diffractive optical element or the micro lens array which is formed by an amorphous (noncrystalline) material such as silica. Consequently, there is a disadvantage that a transmittance is lowered, which causes light amount loss.

In the view of the foregoing, it is an object of the invention to provide an illumination optical device, wherein a micro channel is not generated practically in a diffractive optical element or a refractive optical element arranged in an optical path of pulse laser light having high energy density. Further, it is another object of the invention to provide a photolithography machine and an exposure method capable of performing good projection exposure with high throughput by using an illumination optical device, wherein a micro channel is not generated practically in a diffractive optical element or a refractive optical element arranged in the optical path of the pulse laser light having high energy density.

DISCLOSURE OF THE INVENTION

In order to solve the foregoing problems, a first invention of the present invention provides an illumination optical device having a light source for supplying pulse laser light, which illuminates an irradiated plane with light from the light source, comprising:

a diffractive optical element arranged in an optical path between the light source and the irradiated plane, through which a light beam having an energy density of 1 mJ/cm$^2$/pulse or more passes, wherein an optical material forming the diffractive optical element includes an oxide crystal material.

A second invention of the present invention provides an illumination optical device having a light source for supplying pulse laser light, which illuminates an irradiated plane with light from the light source, comprising:

a refractive optical element arranged in an optical path between the light source and the irradiated plane, through which a light beam having an energy density of 1 mJ/cm$^2$/pulse or more passes, wherein the refractive optical element has a refraction pattern arranged one-dimensionally or two-dimensionally, and wherein an optical material forming the refractive optical element includes an oxide crystal material.

According to a preferable aspect of the first invention and the second invention, the oxide crystal material is one of quartz crystal (crystallized silica: $SiO_2$), barium titanate ($BaTiO_3$), titanium trioxide ($TiO_3$), magnesium oxide (MgO), and sapphire ($Al_2O_3$). As the crystallized silica ($SiO_2$), for example, the quartz crystal can be used. Further, it is preferable that the diffractive optical element or the refractive optical element transforms an incident light beam into a light beam having a given light intensity distribution. Further, it is preferable that the illumination optical device further comprises an optical integrator for forming a secondary light source in a given shape on an illumination pupil plane based on a light beam through the diffractive optical element or the refractive optical element.

Further, in the first invention, it is preferable that an optical material forming the diffractive optical element arranged in an optical path through which a light beam having an energy density of 10 $mJ/cm^2$/pulse or more passes includes the oxide crystal material. Further, in the second invention, it is preferable that an optical material forming a refractive optical element having a refraction pattern arranged one-dimensionally or two-dimensionally, which is arranged in an optical path through which a light beam having an energy density of 10 $mJ/cm^2$/pulse or more passes includes the oxide crystal material. According to a preferable aspect of the first invention and the second invention, it is preferable that an optic axis of the oxide crystal material is set parallel to an optical axis of the illumination optical device. Here, for example, in the case of biaxial crystal, there are two optic axes. In this case, it is enough that one of these optic axes is set parallel to the optical axis.

A third invention of the present invention provides a photolithography machine, comprising: the illumination optical device of the first invention or the second invention; and a projection optical system for projecting and exposing a pattern of a mask arranged on the irradiated plane on a photosensitive substrate.

A fourth invention of the present invention provides an exposure method, wherein a mask is illuminated through the illumination optical device of the first invention or the second invention, and wherein an image of a pattern formed on the illuminated mask is projected and exposed on a photosensitive substrate.

BEST MODE FOR CARRYING OUT THE INVENTION

An embodiment of the invention will be described with reference to the attached drawings.

Figure 1:
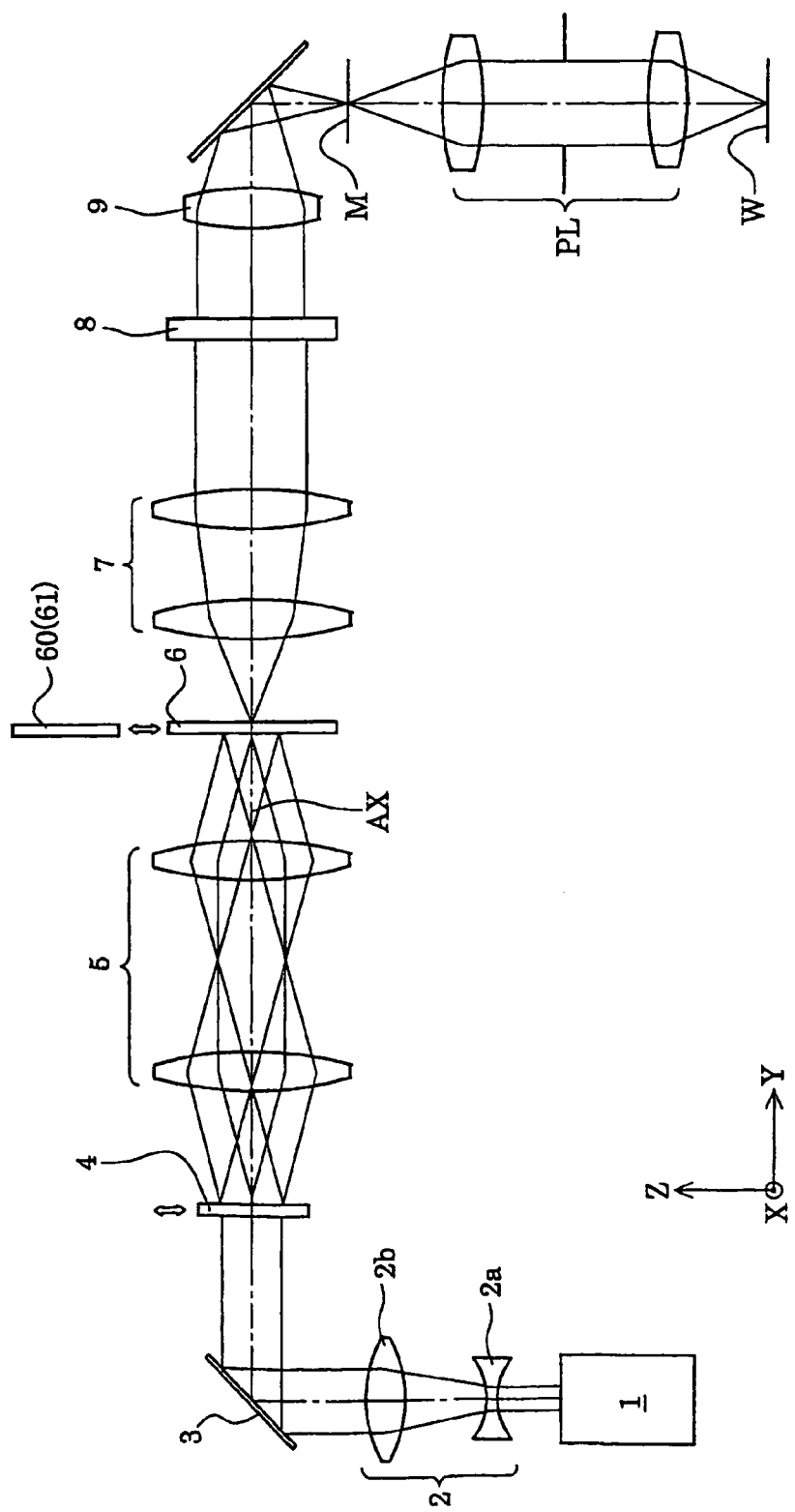
FIG. 1 is a view schematically showing a construction of a photolithography machine comprising an illumination optical device according to an embodiment of the invention.

FIG. 1 is a view schematically showing a construction of a photolithography machine comprising an illumination optical device according to the embodiment of the invention. In FIG. 1, Z axis is set along the normal line of a wafer W, a photosensitive substrate, Y axis is set in the direction parallel to a paper plane of FIG. 1 in a wafer plane, and X axis is set in the direction perpendicular to the paper face of FIG. 1 in the wafer plane respectively. In FIG. 1, the illumination optical device is set to perform annular illumination.

The photolithography machine of FIG. 1 comprises a pulse oscillation type laser light source 1 for supplying exposure light (illumination light). As the laser light source 1, for example, a KrF excimer laser light source for supplying light having a wavelength of 248 nm, an ArF excimer laser light source for supplying light having a wavelength of 193 nm and the like can be used. An almost parallel light beam emitted from the laser light source 1 along the Z direction has a rectangular cross section longly extending along the X direction. The light beam enters a beam expander 2 constructed from a pair of lenses 2a and 2b. The respective lenses 2a and 2b have negative refracting power and positive refracting power in the paper plane (YZ plain) of FIG. 1 respectively. Therefore, the light beam entering the beam expander 2 is expanded in the paper plane of FIG. 1, and faired into a light beam having a given rectangular cross section.

An almost parallel light beam through the beam expander 2 as an optical shaping system is deflected in the Y direction by a deflecting mirror 3, and then enters an afocal zoom lens 5 through a diffractive optical element 4. In general, the diffractive optical element is constructed by forming steps having a pitch of about a wavelength of exposure light (illumination light) on a substrate. The diffractive optical element has an action for diffracting an incident beam at a desired angle. More specifically, when a parallel light beam having a rectangular cross section enters the diffractive optical element 4, the diffractive optical element 4 has a function to form a circular light intensity distribution in a far field thereof (or Fraunhofer diffraction region). Therefore, the light beam through the diffractive optical element 4 forms the circular light intensity distribution, that is, a light beam having a circular cross section in the position of a pupil of the afocal zoom lens 5.

The diffractive optical element 4 is constructed to be able to retreat from an illumination optical path. The afocal zoom lens 5 is constructed to be able to continuously change magnifications in a given range while maintaining an afocal system (afocal optical system). A light beam through the afocal zoom lens 5 enters a diffractive optical element 6 for annular illumination. The afocal zoom lens 5 optically connects a divergence original point of the diffractive optical element 4 and a diffracting plane of the diffractive optical element 6 almost conjugately. Numerical aperture of the light beam focusing on one point of the diffracting plane of the diffractive optical element 6 or the plane in the vicinity thereof varies according to magnifications of the afocal zoom lens 5.

When a parallel light beam enters the diffractive optical element 6 for annular illumination, the diffractive optical element 6 for annular illumination has a function to form a ring light intensity distribution in a far field thereof. The diffractive optical element 6 is constructed removably from the illumination optical path. In addition, the diffractive optical element 6 is constructed changeably with a diffractive optical element 60 for quadrupole illumination or a diffractive optical element 61 for circular illumination. Constructions and actions of the diffractive optical element 60 for quadrupole illumination and the diffractive optical element 61 for circular illumination will be described later.

A light beam through the diffractive optical element 6 enters a zoom lens 7. In the vicinity of a rear side focal plane of the zoom lens 7, an entrance surface of a microlens array (or fly's eye lens) 8 is positioned. The microlens array 8 is an optical device constructed from many minute lenses having positive refracting power arranged vertically and horizontally and densely. In general, the microlens array is constructed by forming a group of minute lenses by, for example, providing etching process for a parallel plane plate.

Here, each minute lens constructing the microlens array is smaller than each lens element constructing the fly's eye lens. Further, differently from the fly's eye lens constructed from the lens elements completely separated from each other, the microlens array is integrally formed while many minute lenses (minute refraction surfaces) are not completely separated from each other. However, in the view that the lens elements having positive refracting power are arranged vertically and horizontally, the microlens array is the same wavefront segmentation type optical integrator as the fly's eye lens.

As described above, the light beam from the circular light intensity distribution formed in the position of the pupil of the afocal zoom lens 5 through the diffractive optical element 4 is emitted from the afocal zoom lens 5. After that, the emitted light beam becomes a light beam having various angle elements, which enters the diffractive optical element 6. That is, the diffractive optical element 4 constructs an optical integrator having an angle light beam formation function. Meanwhile, when the parallel light beam enters the diffractive optical element 6, the diffractive optical element 6 has a function as a light beam transformation device for forming a ring light intensity distribution in the far field thereof. Therefore, the light beam through the diffractive optical element 6 forms, for example, an annular illumination field centering on an optical axis AX on the rear side focal plane of the zoom lens 7 (then on the entrance surface of the microlens array 8).

An outer diameter of the annular illumination field formed on the entrance surface of the microlens array 8 varies according to focal lengths of the zoom lens 7. Therefore, the zoom lens 7 practically connects the diffractive optical element 6 and the entrance surface of the microlens array 8 in a state of Fourier transformation relationship. A light beam entering the microlens array 8 is segmentalized two-dimensionally. Many light sources (hereinafter referred to as "secondary light source") in the same annular state as in the illumination field formed by the incident light beam are formed on the rear side focal plane thereof.

A light beam from the annular secondary light source formed on the rear side focal plane of the micro lens array 8 receives a condensing action of a condenser optical system 9, and then illuminates in a state of superimposition a mask M wherein a given pattern is formed. A light beam passing through the pattern of the mask M forms an image of the mask pattern on the wafer W, the photosensitive substrate through a projection optical system PL. Thereby, the pattern of the mask M is sequentially exposed in each exposure region of the wafer W by performing exposure in block or scanning exposure while two-dimensionally drive-controlling the wafer W in the plane (XY plane) perpendicular to the optical axis AX of the projection optical system PL.

In the embodiment, when a magnification of the afocal zoom lens 5 is changed, a center height of the annular secondary light source(distance between a center line of the circle and the optical axis AX) is not changed, but only a width thereof (½ of a difference between an outer diameter (diameter) and an internal diameter (diameter)) is changed. That is, it is possible to change both a size (outer diameter) and a shape (annular ratio: internal diameter/outer diameter) of the annular secondary light source by changing magnifications of the afocal zoom lens 5.

Further, when the focal length of the zoom lens 7 is changed, the annular ratio of the annular secondary light source is not changed, but both the center height and the width thereof are changed. That is, it is possible to change an outer diameter of the annular secondary light source without changing the annular ratio thereof by changing the focal length of the zoom lens 7. Therefore, in this embodiment, only the annular ratio of the annular secondary light source can be changed without changing the outer diameter thereof by changing magnifications of the afocal zoom lens 5 and focal lengths of the zoom lens 7 as appropriate.

Quadrupole illumination can be performed by setting the diffractive optical element 60 in the illumination optical path instead of the diffractive optical element 6. When a parallel light beam enters the diffractive optical element 60 for quadrupole illumination, the diffractive optical element 60 for quadrupole illumination has a function to form a four point light intensity distribution in a far field thereof. Therefore, a light beam through the diffractive optical element 60 forms a quadrupole illumination field constructed from four circular illumination fields centering on, for example, the optical axis AX on the entrance surface of the microlens array 8. In result, the same quadrupole secondary light source as in the illumination field formed on the entrance surface of the microlens array 8 is formed on the rear side focal plane of the microlens array 8.

As in the case of the annular illumination, it is also possible in the quadrupole illumination that both an outer diameter of the quadrupole secondary light source (diameter of a circumscribed circle of four circular plane light sources) and an annular ratio thereof (diameter of an inscribed circle of the four circular plane light sources/diameter of the circumscribed circle of the four circular plane light sources) are changed by changing magnifications of the afocal zoom lens 5. Further, it is possible to change the outer diameter of the quadrupole secondary light source without changing the annular ratio thereof by changing the focal length of the zoom lens 7. In result, only the annular ratio of the quadrupole secondary light source can be changed without changing the outer diameter of the quadrupole secondary light source by changing magnifications of the afocal zoom lens 5 and focal lengths of the zoom lens 7 as appropriate.

Further, ordinary circular illumination can be performed by retiring the diffractive optical element 4 from the illumination optical path and setting the diffractive optical element 61 for circular illumination in the illumination optical path instead of the diffractive optical elements 6 or 60. In this case, a light beam having a rectangular cross section enters the afocal zoom lens 5 along the optical axis AX. The light beam entering the afocal zoom lens 5 is expanded or reduced according to the magnification, is emitted from the afocal zoom lens 5 along the optical axis AX while being the light beam having the rectangular cross section as it is, and enters the diffractive optical element 61.

Here, similarly to the diffractive optical element 4, when a parallel light beam having a rectangular cross section enters the diffractive optical element 61 for circular illumination, the diffractive optical element 61 for circular illumination has a function to form a circular light intensity distribution in a far field thereof. Therefore, the circular light beam formed by the diffractive optical element 61 forms a circular illumination field centering on the optical axis AX on the entrance surface of the microlens array 8 through the zoom lens 7. In result, a circular secondary light source centering on the optical axis AX is formed on the rear side focal plane of the microlens array 8 as well. In this case, an outer diameter of the circular secondary light source can be changed as appropriate by changing magnifications of the afocal zoom lens 5 or focal lengths of the zoom lens 7.

In this embodiment, regarding pulse laser light supplied from the laser light source 1, a cross section of its light beam is expanded to some extent through the beam expander 2. However, the pulse laser light enters the diffractive optical element 4 in a state of having very high energy density. More specifically, an energy density per one pulse of the pulse laser light entering the diffractive optical element 4 may reach, for example, 20 mJ/cm$^2$/pulse or more. In this case, when the diffractive optical element 4 is formed by an amorphous (noncrystalline) material such as silica according to related arts, a micro channel is generated on the emission surface of the diffractive optical element 4. In result, a transmittance of the diffractive optical element 4 is lowered. Further, due to light amount loss in the diffractive optical element 4, throughput of the photolithography machine is lowered.

Therefore, in this embodiment, the diffractive optical element 4 is formed by using an oxide crystal material such as quartz crystal (crystallized silica: $SiO_2$). In the diffractive optical element 4 formed by the quartz crystal, the micro channel is not generated even if irradiated with pulse laser light having high energy density. Furthermore, it is possible to form a fine diffraction pattern by using dry etching techniques such as plasma etching and ion etching. In this connection, when a fluoride crystal material such as fluorite ($CaF_2$) is used, it is possible to inhibit generation of the micro channel. In this case, however, there is a problem that it takes very long to form the fine diffraction pattern by using the dry etching technique.

Here, the oxide crystal material forming the diffractive optical element 4 is not limited to the quartz crystal. According to wavelengths of the light source, for example, barium titanate ($BaTiO_3$), titanium trioxide ($TiO_3$), magnesium oxide (MgO), or sapphire ($Al_2O_3$) can be used. As described above, in this embodiment, since the diffractive optical element 4 arranged in the optical path of the pulse laser light having high energy density is formed by the oxide crystal material, the micro channel is not generated practically, the fine diffraction pattern can be easily formed by the dry etching, and good projection exposure can be performed with high throughput. Further, when the oxide crystal material has double refraction characteristics, it is preferable to set an optic axis of the oxide crystal material parallel to an optical axis of an illumination optical device. Thereby, it becomes possible to minimize the effects of the double refraction. When the oxide crystal material is a biaxial crystal, there are two optic axes in the oxide crystal material. In this case, it is enough that one of these optic axes is set parallel to the optical axis.

In the foregoing embodiment, the invention is applied to the diffractive optical element 4 as the optical integrator having the angle light beam formation function. However, application is not limited thereto. The invention can be also applied to a general diffractive optical element arranged in an optical path between the laser light source 1 and the mask M, through which a light beam having an energy density of 1 mJ/cm$^2$/pulse or more passes.

In the foregoing embodiment, a modification wherein a microlens array constructed from, for example, regular hexagonal or square minute lenses is used instead of the diffractive optical element 4 can be adopted. In this case, in the quadrupole illumination, a quadrupole secondary light source constructed from four regular hexagonal or square plane light sources is formed on the rear side focal plane of the microlens array 8. In this modification, the micro channel is also generated on the emission surface of the microlens array when the microlens array is formed by the silica according to the related arts. However, when the microlens array is formed by the oxide crystal material such as the quartz crystal according to the invention, the micro channel is not generated practically, and a fine refraction pattern can be easily formed by the dry etching.

Therefore, though the invention is applied to the diffractive optical element in the foregoing embodiment, the application is not limited thereto. The invention can be applied to a general refractive optical element arranged in an optical path between the laser light source 1 and the mask M, through which a light beam with an energy density of 1 mJ/cm$^2$/pulse or more passes, and having a refraction pattern arranged one-dimensionally or two-dimensionally.

In the photolithography machine according to the foregoing embodiment, a micro device (semiconductor device, image pickup device, liquid crystal display device, thin film magnetic head and the like) can be manufactured by illuminating the mask (reticle) by the illumination optical device (illumination step), and exposing the pattern for transfer formed on the mask on the photosensitive substrate by using the projection optical system (exposure step). Descriptions will be hereinafter given of an example of a technique in obtaining a semiconductor device as a micro device by forming a given circuit pattern on a wafer or the like as a photosensitive substrate by using the photolithography machine of the foregoing embodiment with reference to the flowchart of FIG. 2.

Figure 2:
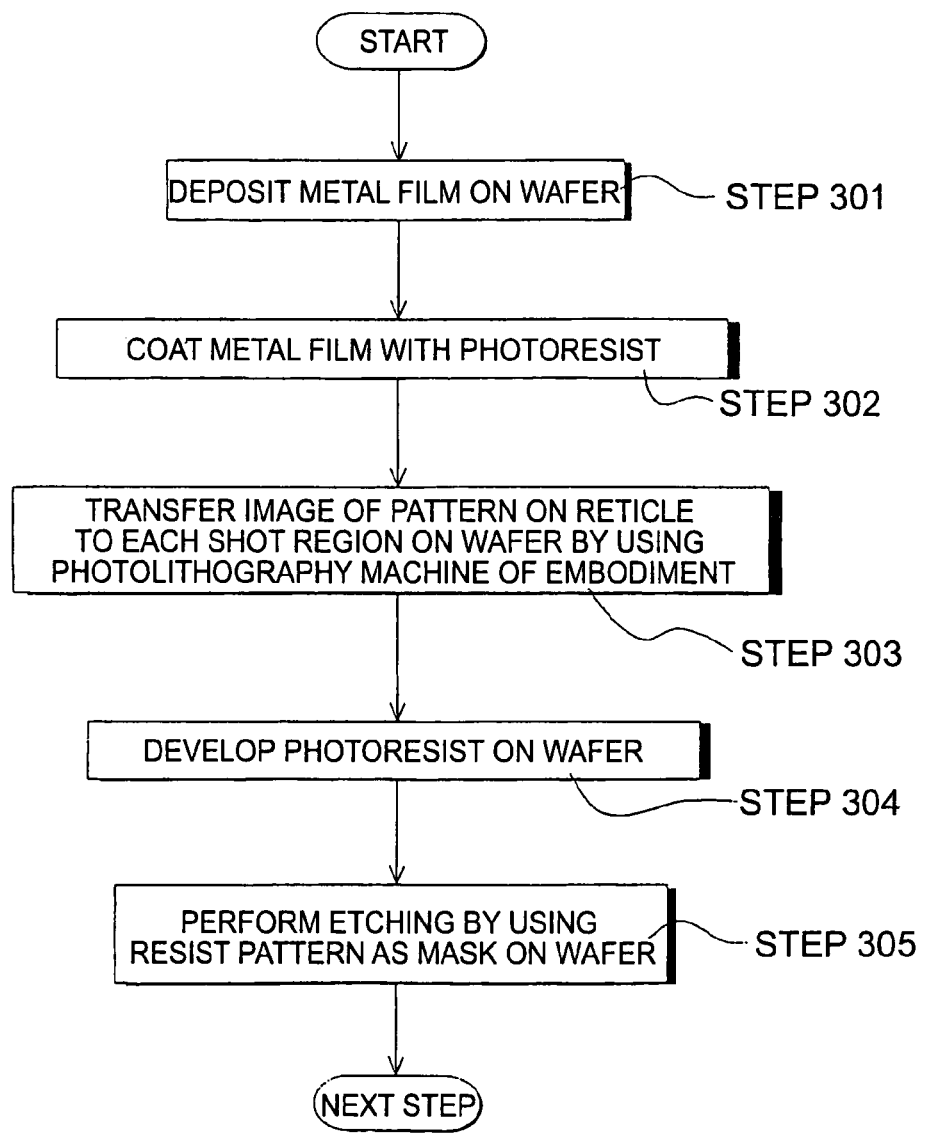
FIG. 2 is a flowchart of a technique in obtaining a semiconductor device as a micro device.

First, in Step 301 of FIG. 2, a metal film is deposited on one lot of wafer. In the next Step 302, the metal film on the one lot of wafer is coated with photoresist. After that, in Step 303, an image of a pattern on the mask is sequentially exposed and transferred in each shot region on the one lot of wafer through the projection optical system by using the photolithography machine of the foregoing embodiment. After that, in Step 304, the photoresist on the one lot of wafer is developed. Then, in Step 305, etching is performed by using the resist pattern as a mask on the one lot of wafer. Thereby, a circuit pattern corresponding to the pattern on the mask is formed in each shot region on each wafer. After that, for example, a circuit pattern of an upper layer is further formed, and thereby the device such as the semiconductor device is manufactured. According to the foregoing method of manufacturing semiconductor devices, it is possible to obtain a semiconductor device having a very fine circuit pattern with good throughput.

Figure 3:
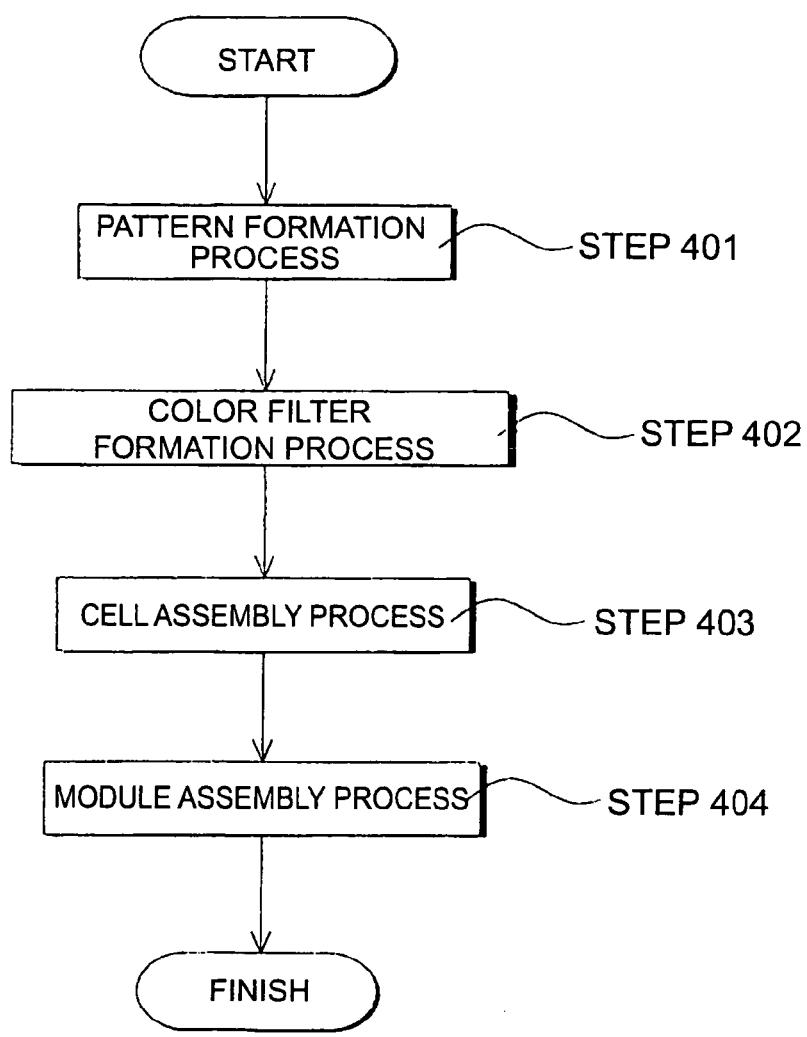
FIG. 3 is a flowchart of a technique in obtaining a liquid crystal display device as a micro device.

Further, in the photolithography machine of the foregoing embodiment, a liquid crystal display device as a micro device can be obtained by forming a given pattern (circuit pattern, electrode pattern and the like) on a plate (glass substrate). Descriptions will be hereinafter given of an example of a technique used then with reference to the flowchart of FIG. 3. In FIG. 3, in pattern formation step 401, so-called photolithography step, wherein a pattern of a mask is transferred and exposed on a photosensitive substrate (glass substrate or the like coated with resist) by using the photolithography machine of the foregoing embodiment is performed. By this photolithography step, a given pattern including many electrodes and the like is formed on the photosensitive substrate. After that, the exposed substrate is provided with respective steps such as development step, etching step, and resist exfoliation step. Thereby, a given pattern is formed on the substrate. The procedure is forwarded to the next color filter formation step 402.

Next, in the color filter formation step 402, a color filter wherein many groups constructed from three dots corresponding to R (Red), G (Green), and B (Blue) are arranged in a state of a matrix, or a color filter wherein a plurality of filter groups constructed from three stripes of R, G, and B are arranged in the direction of horizontal scanning line is formed. Then, after the color filter formation step 402, cell assembly step 403 is performed. In the cell assembly step 403, a liquid crystal panel (liquid crystal cell) is assembled by using the substrate having the given pattern obtained in the pattern formation step 401, the color filter obtained in the color filter formation step 402 and the like. In the cell assembly step 403, the liquid crystal panel (liquid crystal cell) is manufactured by, for example, injecting liquid crystal between the substrate having the given pattern obtained in the pattern formation step 401 and the color filter obtained in the color filter formation step 402.

After that, in module assembly step 404, respective parts such as an electric circuit for making display operation of the assembled liquid crystal panel (liquid crystal cell) and a backlight are installed to complete the liquid crystal display device. According to the foregoing method of manufacturing liquid crystal display devices, it is possible to obtain a liquid crystal display device having a very fine circuit pattern with good throughput.

In the foregoing embodiment, the mask M is illuminated in a state of superimposition by condensing light from the secondary light source by the condenser optical system 9. However, the invention is not limited thereto. It is possible that an illumination field stop (mask blind) and a relay optical system for forming an image of this illumination field stop on the mask M are arranged in the optical path between the condenser optical system 9 and the mask M. In this case, the condenser optical system 9 condenses light from the secondary light source for illuminating the illumination field stop in a state of superimposition. The relay optical system forms the image of an aperture part (light transmittance part) of the illumination field stop on the mask M.

Further, in the foregoing embodiment, the KrF excimer laser light (wavelength: 248 nm) or the ArF excimer laser light (wavelength: 193 nm) is used as exposure light. However, the invention is not limited thereto. The invention can be also applied to other appropriate pulse oscillation type laser light source. Further, in the foregoing embodiment, the invention has been described taking the example of the projection photolithography machine comprising the illumination optical device. However, it is clear that the invention can be applied to a general illumination optical device for illuminating irradiated planes other than the mask.

INDUSTRIAL APPLICABILITY

As described above, in an illumination optical device of the invention, a diffractive optical element or a refractive optical element arranged in an optical path of pulse laser light having high energy density is formed by an oxide crystal material such as quartz crystal. Therefore, a micro channel is not generated practically, and it is easy to form a fine diffraction pattern and a fine refraction pattern by dry etching.

Therefore, in a photolithography machine and an exposure method of the invention, a good device can be manufactured by performing good projection exposure with high throughput, by using the illumination optical device wherein the micro channel is not generated practically in the diffractive optical element or the refractive optical element arranged in the optical path of the pulse laser light having high energy density.

The invention claimed is:

1. An illumination optical device for illuminating an irradiated plane with light from a light source supplying pulse laser light, comprising:
   a diffractive optical element arranged in an optical path between the light source and the irradiated plane, wherein
   an optical material forming the diffractive optical element includes an oxide crystal material, an optic axis of the oxide crystal material is set approximately parallel to an optical axis of the illumination optical device; and
   the diffractive optical element has a surface shape formed on the oxide crystal material.

2. The illumination optical device according to claim 1, wherein the diffractive optical element is arranged in the optical path between the light source and the irradiated plane, through which a light beam passes having an energy density of 1 mJ/cm$^2$/pulse or more.

3. The illumination optical device according to claim 1, wherein the oxide crystal material is one of quartz crystal ($SiO_2$), barium titanate ($BaTiO_3$), titanium trioxide ($TiO_3$), magnesium oxide (MgO), and sapphire ($Al_2O_3$).

4. The illumination optical device according to claim 3, wherein the surface shape of the diffractive optical element is formed by dry etching.

5. The illumination optical device according to claim 1, wherein the diffractive optical element transforms an incident light beam into a light beam having a given light intensity distribution.

6. The illumination optical device according to claim 1, further comprising:
   an optical integrator for forming a secondary light source in a given shape on an illumination pupil plane based on a light beam passing through the diffractive optical element.

7. The illumination optical device according to claim 1, wherein
   the oxide crystal material comprises a plurality of optic axes, and wherein
   one of the plurality of optic axes is set approximately parallel to the optical axis of the illumination optical device.

8. A photolithography machine, comprising:
   the illumination optical device according to claim 1; and
   a projection optical system for projecting and exposing a pattern of a mask arranged on the irradiated plane on a photosensitive substrate.

9. An exposure method, comprising the steps of:
   illuminating a mask through the illumination optical device according to claim 1; and
   projecting and exposing an image of a pattern formed on the illuminated mask on a photosensitive substrate.

10. The illumination optical device according to claim 1, wherein the diffractive optical element is arranged in the optical path between the light source and the irradiated plane, through which a light beam passes having an energy density of 10 mJ/cm$^2$/pulse or more.

11. A diffractive optical element for transforming an input pulse laser beam into a radiation beam having a predetermined sectional shape, comprising:
    a radiation transparent member made of an oxide crystal material, an optic axis of the oxide crystal material is set approximately parallel to a propagation direction of the input laser beam; and
    a surface shape formed on the oxide crystal material of the radiation transparent member, wherein the input pulse laser beam is diffracted by the surface shape formed on the oxide crystal material.

12. The diffractive optical element according to claim 11, wherein the surface shape of the oxide crystal material is formed by dry etching.

13. The diffractive optical element according to claim 12, wherein the diffracted input laser beam diffracted by the surface shape forms the predetermined sectional shape.

14. The diffractive optical element according to claim 11, wherein the diffracted input laser beam diffracted by the surface shape forms the predetermined sectional shape.

15. The diffractive optical element according to claim 11, wherein the oxide crystal material is one of quartz crystal ($SiO_2$), barium titanate ($BaTiO_3$), titanium trioxide ($TiO_3$), magnesium oxide (MgO), and sapphire ($Al_2O_3$).

16. A method of manufacturing a diffractive optical element for transforming an input pulse laser beam into a radiation beam having a predetermined sectional shape, comprising:

preparing a radiation transparent member made of an oxide crystal material;

setting an optic axis of the oxide crystal material approximately parallel to a propagation direction of the input pulse laser beam; and forming a surface shape on the oxide crystal material of the radiation transparent member, wherein the surface shape diffracts the input pulse laser beam.

17. The method according to claim 16, wherein the surface shape of the oxide crystal material is formed by dry etching.

18. The method according to claim 16, wherein the oxide crystal material is one of quartz crystal ($SiO_2$), barium titanate ($BaTiO_3$), titanium trioxide ($TiO_3$), magnesium oxide (MgO), and sapphire ($Al_2O_3$).

19. The method according to claim 18, wherein the diffracted input laser beam diffracted by the surface shape forms the predetermined sectional shape.

20. The diffractive optical element formed by the method according to claim 16.

* * * * *